(12) United States Patent
Uchida et al.

(10) Patent No.: US 7,238,044 B2
(45) Date of Patent: Jul. 3, 2007

(54) CONNECTION STRUCTURE OF PRINTED WIRING BOARD

(75) Inventors: Shinji Uchida, Kanagawa (JP);
Hideyasu Yamada, Kanagawa (JP);
Akihito Funakoshi, Kanagawa (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/554,693

(22) PCT Filed: Mar. 23, 2004

(86) PCT No.: PCT/JP2004/003965

§ 371 (c)(1),
(2), (4) Date: Oct. 27, 2005

(87) PCT Pub. No.: WO2004/098249

PCT Pub. Date: Nov. 11, 2004

(65) Prior Publication Data
US 2006/0281361 A1    Dec. 14, 2006

(30) Foreign Application Priority Data
Apr. 30, 2003  (JP) ............................. 2003-125677

(51) Int. Cl.
H01R 12/24 (2006.01)
(52) U.S. Cl. ........................................ 439/492; 439/67
(58) Field of Classification Search ................ 439/492, 439/77, 67, 495, 206; 174/117 F
See application file for complete search history.

(56) References Cited

U.S. PATENT DOCUMENTS

| | | | | |
|---|---|---|---|---|
| 4,116,516 A | * | 9/1978 | Griffin | 439/67 |
| 4,752,244 A | * | 6/1988 | Kuhl et al. | 439/635 |
| 4,859,205 A | * | 8/1989 | Fritz | 439/492 |
| 5,205,740 A | * | 4/1993 | Frankeny et al. | 439/67 |
| 5,219,292 A | * | 6/1993 | Dickirson et al. | 439/67 |

FOREIGN PATENT DOCUMENTS

| | | |
|---|---|---|
| JP | S63-009772 U | 1/1988 |
| JP | H07-183070 A | 7/1995 |
| JP | H09-102368 A | 4/1997 |
| JP | H11-288769 A | 10/1999 |
| JP | 2002-015800 A | 1/2002 |
| JP | 2002-083848 A | 3/2002 |
| JP | 2002-158055 A | 5/2002 |

OTHER PUBLICATIONS

Internaional Search Report mailed on May 11, 2004.

* cited by examiner

*Primary Examiner*—James R. Harvey
*Assistant Examiner*—Travis Chambers
(74) *Attorney, Agent, or Firm*—Rader, Fishman & Grauer PLLC

(57) ABSTRACT

An FPC is electrically connected to a printed wiring board. The FPC includes an elongated substrate and a conductor part laminated on the face of the substrate. The conductor part includes a plurality of conductors extending along the axial direction of the substrate, and elastically deformable first contact terminals each of which extends from the face of the conductors toward the base end of the FPC. The printed wiring board includes an insertion opening formed at the edge surface thereof, and plural line connecting terminals which are formed on the internal wall surface of the insertion opening, and which extend in the inserting direction for inserting the FPC.

15 Claims, 6 Drawing Sheets

CONNECTION STRUCTURE OF PRINTED WIRING BOARD

FIELD OF THE INVENTION

The present invention relates to a structure for a printed wiring board. More particularly, the present invention relates to a structure for a printed wiring board for electrically connecting a printed wiring board formed from laminating a plurality of board members and FPCs (Flexible Printed Circuits).

RELATED ART

Conventionally, electronic component modules and printed wiring boards are mounted in electronic devices. FPCs have been used to connect these printed wiring boards and electronic component modules.

The printed wiring board includes an insulating substrate, a wiring pattern which is formed on this substrate, and circuit elements, such as ICs and connectors, which are connected to this wiring pattern on the substrate. ZIF (Zero Insertion Force)-type connectors which can be inserted and removed from FPCs with little force are connectors including the circuit elements (for example, see Japanese Patent Application Laid-open Publication No. 2002-158055).

According to this ZIF-type connector, operability of a FPC and a slider can be improved and connection reliability ensured, while realizing miniaturization.

The miniaturization of electronic devices such as mobile phones and mobile devices has been progressing in recent years, and with this miniaturization of electronic devices, the miniaturization and high levels of integration of FPC and printed wiring boards are also in demand. Therefore, in order to meet this demand, in recent years, multilayer printed wiring boards which stack a plurality of substrates have come into wide use.

However, although the above ZIF-type connector realizes low height, it occupies a certain area on the substrate because it is mounted on a surface of the substrate of the printed wiring board. Therefore, there were cases in which mounting circuit elements with high-density became difficult.

In order to solve the above problems, an object of the present invention is to provide a structure for printed wiring boards wherein circuit elements can be mounted with high-density.

SUMMARY OF THE INVENTION

The inventors have invented a structure for printed wiring boards to solve the problems mentioned above as follows.
(1) A connecting structure for a printed wiring board for electrically connecting an FPC, in which the FPC includes:
an elongated substrate; and a conductor part laminated on a surface of the substrate, and in which the conductor part comprises a plurality of conductors extending along the axial direction of the substrate, and first contact terminals each of which extends from the surface of the conductors toward the base end of the FPC, and each of which is elastically deformable, and in which the printed wiring board comprises an insertion opening provided on an edge surface thereof for inserting an end portion of the FPC, and a plurality of line connecting terminals which is formed on the internal wall surface of the insertion opening extending along the inserting direction of the inserting the FPC, and in which upon inserting the end portion of the FPC to the insertion opening of the printed wiring board, a tip of each of first contact terminals of the FPC comes in contact with and presses the line connecting terminal.

The FPC may be a FFC (Flexible Flat Cable). The substrate may be formed of, for example, a thin polyimide film. The substrate may also be laminated with a reinforcing plate.

The conductor part may be formed of a suitable material having conductivity and formability, such as, for example, a copper alloy plate. The conductor part may be plated with nickel or may be treated with conductive hard plating. A base end of the conductor part may be coated with a polyimide film.

The conductors may be formed by being laminated (adhered) to the elongated substrate and etched thereafter. Each of the conductors may be connected to a low voltage power supply or a ground.

Vias, pads-on-holes, and so on, other than the through-hole terminal, may be formed on the printed wiring board.

According to the invention described in (1), since the connector structure to be connected to FPC is provided inside the printed wiring board, a circuit element can be mounted in high density and thus improve a degree of freedom in designing wiring patterns.
(2) A connecting structure for a printed wiring board according to (1), wherein the insertion opening comprises a stepped structure formed on the internal wall surface thereof, and in which upon inserting the FPC to said printed wiring board, the tip of each of the first contact terminals of the FPC is engaged with the stepped structure.

According to the invention described in (2), upon inserting the FPC into the insertion opening of the printed wiring board, each first contact terminal is pressed into the internal wall surface of the insertion opening, and elastically deformed, and comes close to each conductor. Upon inserting the FPC further, the tip of each first contact terminal extends past the stepped structure. Thus, each first contact terminal returns to a position predetermined by the height of the stepped structure, and comes in contact with and is pressed into the line connecting terminal. In this state, it is impossible to pull out the FPC even when trying to pull out the FPC, since the tip of each first contact terminal is engaged with the stepped structure. This allows the FPC to be connected to the printed wiring board surely.
(3) A connecting structure for a printed wiring board according to (1) or (2), in which each of the first contact terminals is formed by bending a part of the conductors.

The first contact terminals may be formed by notching each of the first contact terminals, and bending the notch. Each of the first contact terminals may be formed with around half the width of the each conductor.
(4) A connecting structure for a printed wiring board according to (1) to (3), in which the tips of the first contact terminals are arrayed in a line.
(5) A connecting structure for a printed wiring board for electrically connecting the FPC, in which the FPC includes: an elongated substrate; and a conductor part laminated on the surface of the substrate, and in which the conductor part includes a plurality of conductors extending along the axial direction of the substrate; and second contact terminals which are provided on each surface of the elastically deformable conductors, and wherein each of the second contact terminals extends toward the base end of the FPC, and the tip thereof is bent toward one of the conductors, and wherein the printed wiring board includes an insertion opening formed on the edge surface thereof for inserting the end portion of the FPC, and a plurality of line connecting terminals which is formed on the internal wall surface of the insertion opening extending along the inserting direction of the inserting the FPC, and in which upon inserting the end portion of the FPC into the insertion opening of the printed wiring board, each of the second contact terminals of the FPC comes in contact with and is pressed into one of the line connecting terminals.

Each second contact terminal may be fixed to each conductor by soldering, spot welding, etc. Furthermore, the second contact terminals are preferably formed of the same material as the conductor. For example, the second contact terminals may be formed of copper alloy. Furthermore, each second contact terminal may be subjected to chrome plating or nickel plating after connected to each conductor.

According to the invention described in (5), since the connector structure to be connected to the FPC is provided inside the printed wiring board, circuit elements can be mounted at high density, and thus improves a degree-of-freedom in designing wiring patterns.

Furthermore, merely assembling the second contact terminals to the existing flat conductors of the FPC forms the FPC of the present invention. This allows manufacturing costs of the FPC to be reduced.

(6) A connecting structure for a printed wiring board according to (5), in which the FPC includes an insulating holder plate for connecting the second contact terminals with each other.

According to the invention described in (6), the holder plate allows the second contact terminals to be arrayed at equal pitch. Thus, this allows easy fabrication of the FPC because it only requires that the plural second contact terminals be assembled on the holder plate, thereby integrally forming a single line connecting terminal; then, the single line connecting terminal is assembled with the conductors, omitting the troublesome procedure of mounting each of the second contact terminals to the corresponding conductors.

(7) A connecting structure for a printed wiring board according to (6), in which the holder plate has grooves and in which the second contact terminals are pressed into the grooves of the holder plate, thereby fixing the second contact terminals to the holder plate.

(8) The connecting structure for a printed wiring board according to claims 5 to 7, in which the insertion opening includes a stepped structure formed on the internal wall surface thereof and in which upon inserting the FPC into the printed wiring board, each of the second contact terminals of the FPC is engaged with the stepped structure.

According to the invention described in (8), upon inserting the FPC into the insertion opening of the printed wiring board, each second contact terminal is pressed to the internal wall surface of the insertion opening, is elastically deformed, and comes close to each conductors. Furthermore, upon inserting the FPC further, the tip of each second contact terminal extends past the stepped structure. Thus, each second contact terminal returns to a position predetermined by the height of the stepped structure, and comes in contact with and is pressed into the line connecting terminal.

In this state, it is impossible to pull out the FPC even when trying to pull out the FPC from the printed wiring board, since the tip of each first contact terminal is engaged with the stepped structure. This allows the FPC to be connected to the printed wiring board surely.

(9) The connecting structure for a printed wiring board according to (5) to (8), in which the second contact terminals are arrayed in a line.

(10) The connecting structure for a printed wiring board according to (1), in which the printed wiring board is formed of a lamination of a second outer layer plate, an inner layer plate having a notch formed at an edge surface thereof, and a third outer layer plate, in which the line connecting terminals are provided on the face of the second outer layer plate facing the notch, in which the insertion opening is formed surrounded by the second outer layer plate, the inner layer plate having the notch, and the third outer layer plate.

The above-described second outer layer plate, the inner layer plate, the first outer layer plate, and the third outer layer plate, and a prepreg which will be described hereafter, are generally formed of epoxy resin. They may be formed of, but are not limited to the above, a material having sufficient heat resistance such as polyimide, BT resin, or the like, and a low dielectric constant material such as low dielectric constant epoxy resin, polyphenylene ether resin, or the like.

The inner layer plate is preferably formed with a thickness of 0.2 mm to 1.6 mm, and is more preferably formed with a thickness of 0.6 mm to 1.0 mm.

The first outer layer plate, the second outer layer plate, and the third outer layer plate, are preferably formed with a thickness of 0.2 mm. Furthermore, the copper film is preferably formed with a thickness of 35 μm.

(11) The connecting structure for a printed wiring board according to (5), in which the printed wiring board is formed of the lamination of the second outer layer plate, the inner layer plate having the notch formed at the edge surface thereof, and the third outer layer plate, and in which the line connecting terminals are provided on the face of the second outer layer plate facing the notch, and in which the insertion opening is formed surrounded by the second outer layer plate, the inner layer plate having the notch, and the third outer layer plate.

(12) The connecting structure for a printed wiring board according to (10) or (11), in which the printed wring board includes a first outer layer plate, which has a rectangular opening, between the second outer layer plate and the inner layer plate, and in which the stepped structure is formed of the notch of the inner layer plate and the opening of the first outer layer plate.

(13) The connecting structure for a printed wiring board according to (12), in which the second outer layer plate and the third outer layer plate have wiring patterns on both faces thereof and in which the inner layer plate is formed of an insulating plate and in which the first outer layer plate has a wiring pattern on the face thereof facing the inner layer plate, and in which the second outer layer plate, the first outer layer plate, the inner layer plate, and the third outer layer plate are connected with each other by solder plating.

(14) The connecting structure for a printed wiring board according to (13), in which a prepreg and copper film are further laminated on the first outer layer plate and the third outer layer plate.

(15) The connecting structure for a printed wiring board according to (13) or (14), in which the second outer layer plate is formed penetrating a plurality of through holes therethrough so as to be connected to the line connecting terminals.

According to the invention described in (15), the face of the printed wiring board is electrically connected to the line connecting terminals through the through holes.

Furthermore, a pin, for example, may be inserted into each of the through holes, and tips of the pins press the first or second through hole terminals. This allows extracting these connecting terminals from the printed wiring board easily.

(16) The connecting structure for a printed wiring board according to (10) through (15), in which the line connecting terminals of the printed wiring board are subjected to hard plating.

Examples of hard plating include nickel plating.

According to the invention described in (16), the line connecting terminals are subjected to hard plating. This prevents the line connecting terminals from abrasion thereof, due to rubbing thereof against the first or second contact terminals, in spite of repeated insertion/extraction of the FPC to/from the printed wiring board. In particular, the printed wiring board formed of a glass-epoxy material has a surface with roughness as with a relatively rough whetstone. This leads to the line connecting terminals readily being worn down.

(17) The connecting structure for a printed wiring board according to (16), in which the line connecting terminals of the printed wiring board are subjected to gold plating further on the surface of the hard plating.

According to the invention described in (17), the line connecting terminals have more suitable contact performance because the line connecting terminals are subjected to the gold flash plating after the hard plating.

DESCRIPTION OF THE PREFERRED EMBODIMENTS

Figure 1:
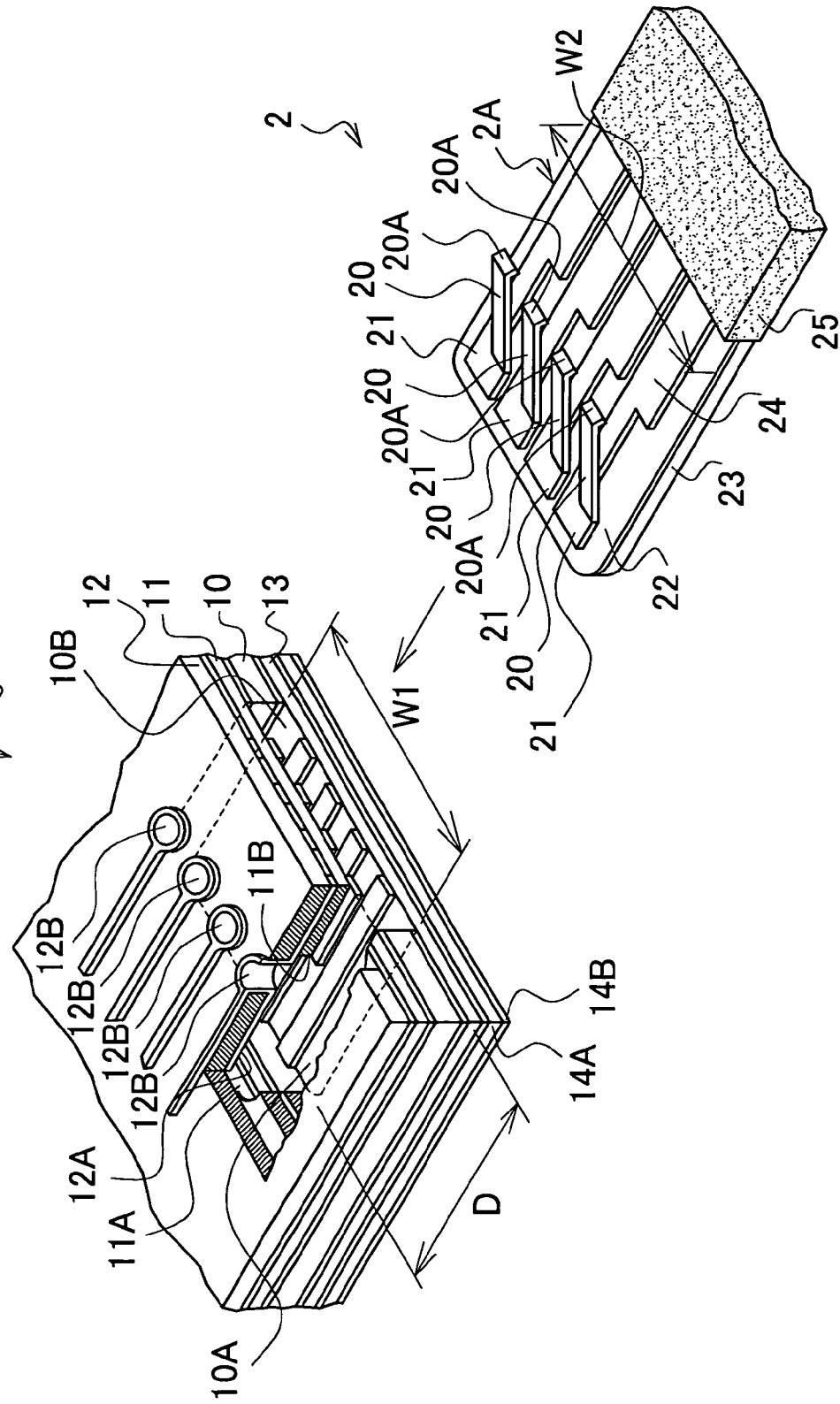
FIG. 1 is a perspective view showing an FPC and a printed wiring board according to a first embodiment of the present invention.

With reference to drawings, each embodiment of the present invention will be described hereinafter in detail. In the description of the embodiments below, identical components are given identical reference numerals and explanation is omitted or simplified for the sake of brevity.

First Embodiment

FIG. 1 is a perspective view showing a FPC 2 and a printed wiring board 1 according to a first embodiment of the present invention.

The FPC 2 includes an elongated substrate 22, a reinforcing plate 23 adhered onto the lower face of the substrate 22, and a conductor part 24 laminated on the upper face of the substrate 22.

While the FPC 2 is coated with a polyimide film 25, an end portion thereof is exposed, thereby forming an exposed conductor part 2A.

The substrate 22 has insulation properties and is formed of a thin polyimide film, for example.

The exposed conductor part 2A includes: conductors 21 which have a width of W2 and extend along the axis of the substrate 22; and elastically deformable first contact terminals 20, each of which is erected on the face of the each conductors 21 and extends toward the base end of the FPC 2.

Each first contact terminal 20 is formed by notching a part of each conductor 21 substantially in the shape of an "L", and by bending up the notched part. The first contact terminal 20 is formed with approximately half the width of the conductor 21.

Figure 2:
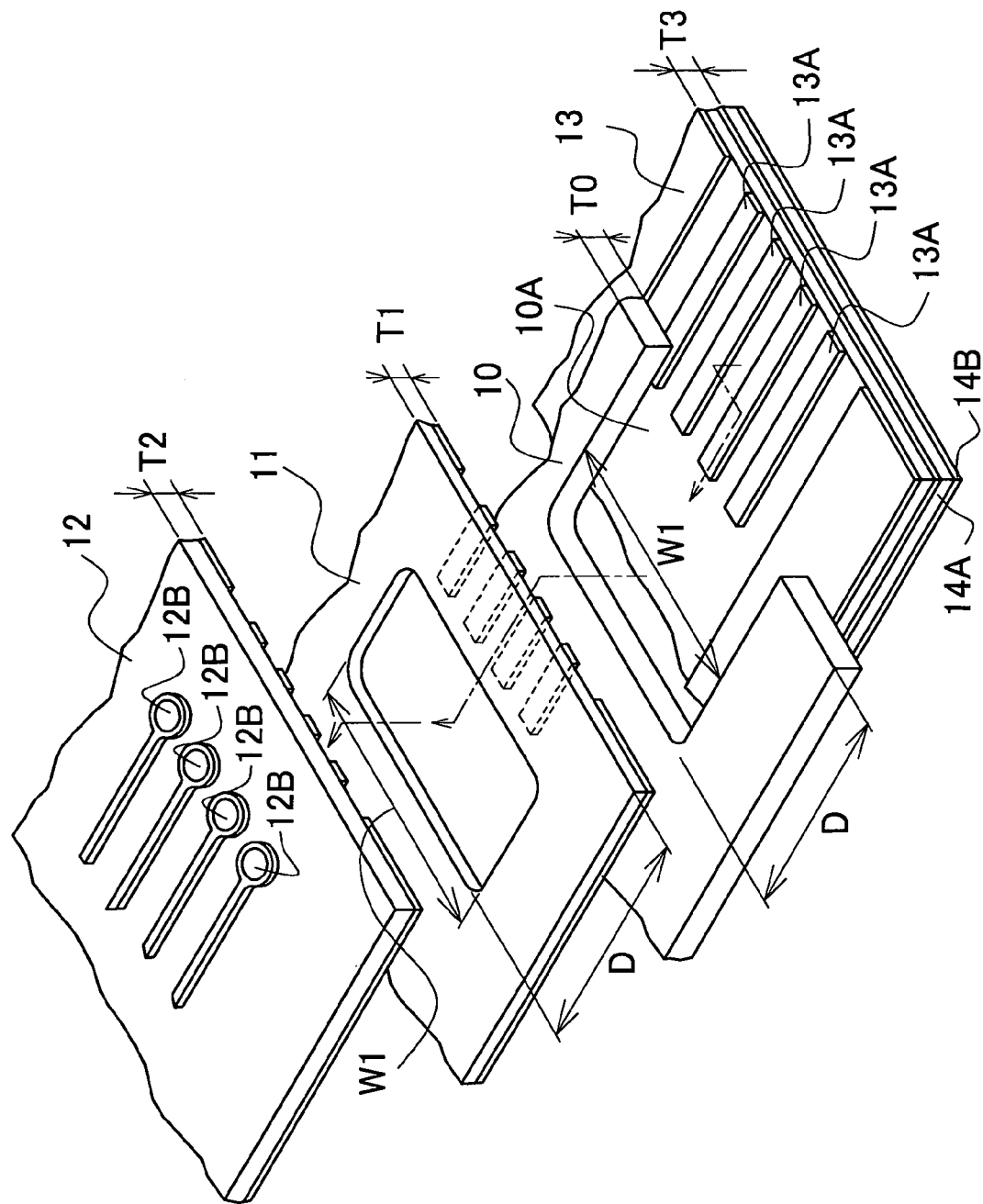
FIG. 2 is an exploded perspective view of the printed wiring board according to the first embodiment.

Each first contact terminal 20 has a protrusion 20A at the tip thereof, which is bent down in the direction substantially perpendicular to the conductor 21. These protrusions 20A may be arrayed in a line. However, this is not so limited, and the protrusions 20A of the first contact terminals may not be arrayed in a line. FIG. 2 is an exploded perspective view of the printed wiring board 1.

The printed wiring board 1 has a structure in which a second outer layer plate 12, an inner layer plate 10, a first outer layer plate 11, and a third outer layer plate 13, are laminated.

The inner layer plate 10 is formed of an insulating plate member, and specifically is formed of an epoxy glass plate. The inner layer plate 10 is formed with a thickness T0, and has a notch 10A formed with a width W1 and with a depth D at the edge surface thereof.

The first outer layer plate 11 is formed with a thickness T1, and specifically is formed with a thickness of 0.2 mm. A wiring pattern is provided on the face of the first outer layer plate 11 facing the inner layer plate 10 by etching of a copper foil. Specifically, the copper foil is formed with a thickness of 35 μm. Furthermore, a rectangular opening 11A with a width W1 is formed substantially at the center of the first outer layer 11. Furthermore, the opening 11A is formed with the same depth D as with the notch 10A.

The second outer layer plate 12 is formed with a thickness T2, and specifically is formed with a thickness of 0.2 mm. Wiring patterns are provided on both faces of the second outer layer plate 12 by etching of copper foils. In particular, each copper foil is formed with a thickness of 35 μm. Through holes 12B are formed after the wiring patterns are provided.

The third outer layer plate 13 is formed with a thickness T3, and specifically is formed with a thickness of 0.2 mm. A wiring pattern 13A is provided on the face of the third outer layer plate 13 facing the inner layer plate 10 by etching of a copper foil. In particular, the copper foil is formed with a thickness of 35 μm. Furthermore, a prepreg 14A and a copper foil 14B are laminated underneath the third outer layer plate 10.

The printed wiring board 1 is manufactured with a procedure described below.

That is to say, the third outer layer plate 13, the inner layer plate 10, the first outer layer plate 11, and the second outer layer plate 12 are laminated in this order, pressed, and then connected by solder plating. Furthermore, after through holes, via holes, pads-on-holes, etc., are formed on the connected layer plates 10 through 13, the layered plates are subjected to plating processing and resist processing.

The second outer layer plate 12, the opening 11A of the first outer layer plate 11, the notch 10A of the inner layer plate 10, and the third outer layer plate 13 form an insertion opening 10B in which is to be inserted the end portion of the FPC 2 provided at the edge surface of the printed wiring board.

Of these components, the notch 10A of the inner layer plate 10 and the opening 11A of the first outer layer plate 11 form a stepped structure 11B on the inter surface of the insertion opening 10B.

The notch 10A and the opening 11A are formed with the width W1 slightly greater than the width W2 of the FPC 2. That suppresses misalignment of the FPC 2 in the width direction thereof. Therefore, each first contact terminal 20 of the FPC 2 and each line connecting terminal 12A formed on the printed wiring board 1 easily correspond to each other.

Figure 3A:
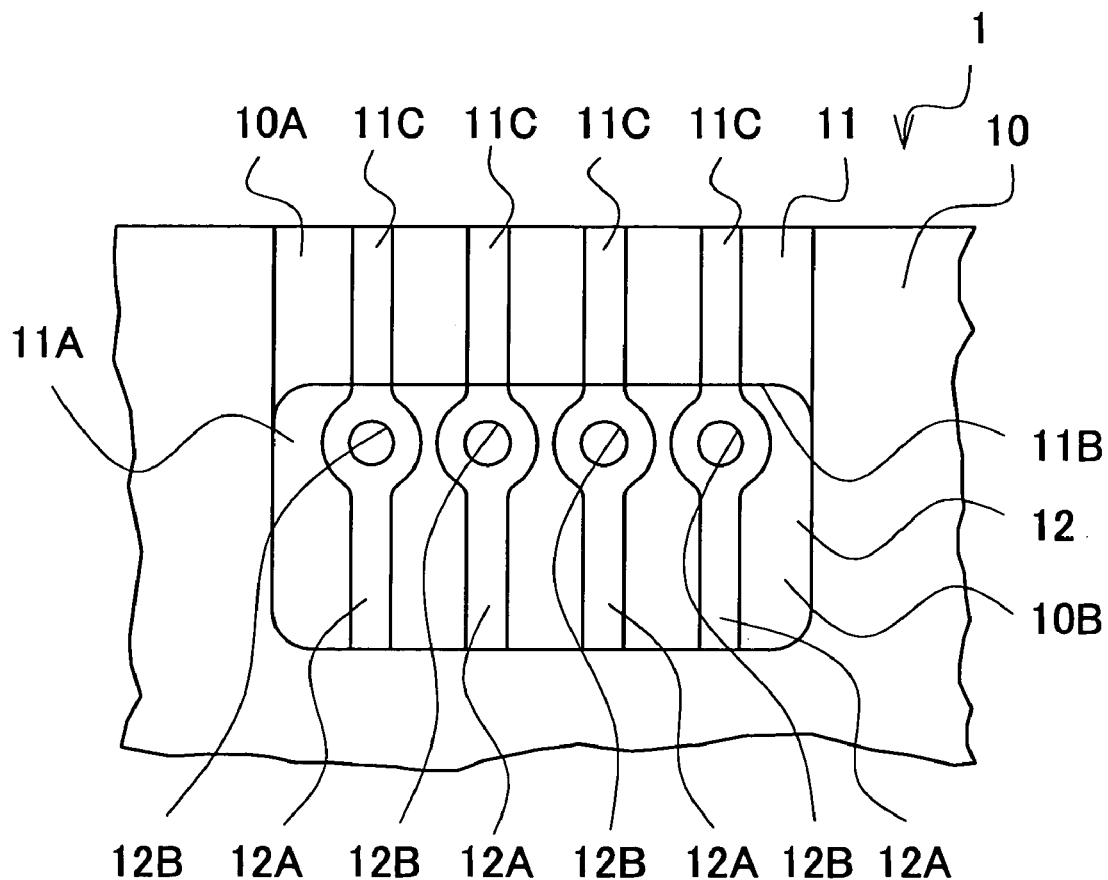
FIG. 3A is a cross-sectional view showing an inner layer plate as viewed from a notch side according to the first embodiment.
Figure 3B:
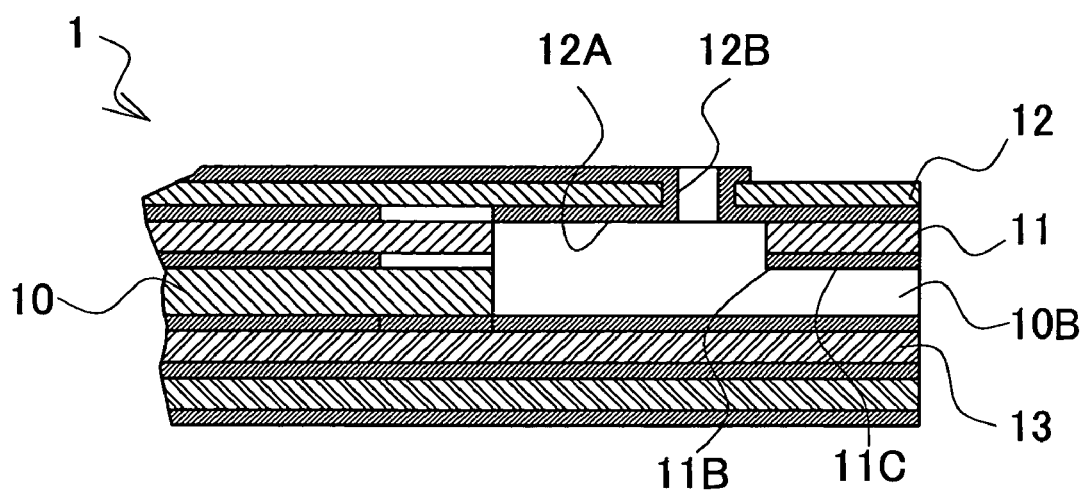
FIG. 3B is a longitudinal cross-sectional view showing the printed wiring board according to the first embodiment.

FIG. 3A is a cross-sectional view of the inner layer plate 10 as viewed from the notch 10A. FIG. 3B is a longitudinal cross-sectional view of the printed wiring board 1.

On the second outer layer plate 12 forming the internal wall surface of the insertion opening 10B, plural line connecting terminals 12A are formed extending in the insertion direction for inserting the FPC 2. These line connecting terminals 12A are disposed at positions corresponding to those of the first contact terminals 20 of the FPC 2.

On the first outer layer plate 11 forming the internal wall surface of the insertion opening 10B, plural wiring patterns 11C extending in the inserting direction for inserting the FPC 2 are formed.

The line connecting terminals 12A and the wiring patterns 11C are subjected to nickel plating which is a hard plating. The line connecting terminals 12A and the wiring patterns 11C may be subjected to hard plating other than nickel plating. Such an arrangement prevents the line connecting terminals 12A and the wiring patterns 11C from abrasion thereof due to rubbing thereof against the first contact terminals 20 in spite of repeated insertion/extraction of the FPC 2 to/from the printed wiring board 1. In particular, the printed wiring board 1 formed of a glass-epoxy material has a surface with roughness as with a relatively rough whetstone. This leads to the line connecting terminals 12A and the wiring patterns 11C being readily worn down.

Furthermore, the line connecting terminals 12A and the wiring patterns 11C are subjected to the gold flash plating on the surface of the nickel plating. Such an arrangement forms the line connecting terminals 12A with superior contact performance. The second outer layer plate 12 of the printed wiring board 1 has plural through holes 12B formed so as to connect the line connecting terminals 12A. The surface of the second outer layer plate 12 is electrically connected to the line connecting terminals 12A through the through holes 12B.

Figure 4:
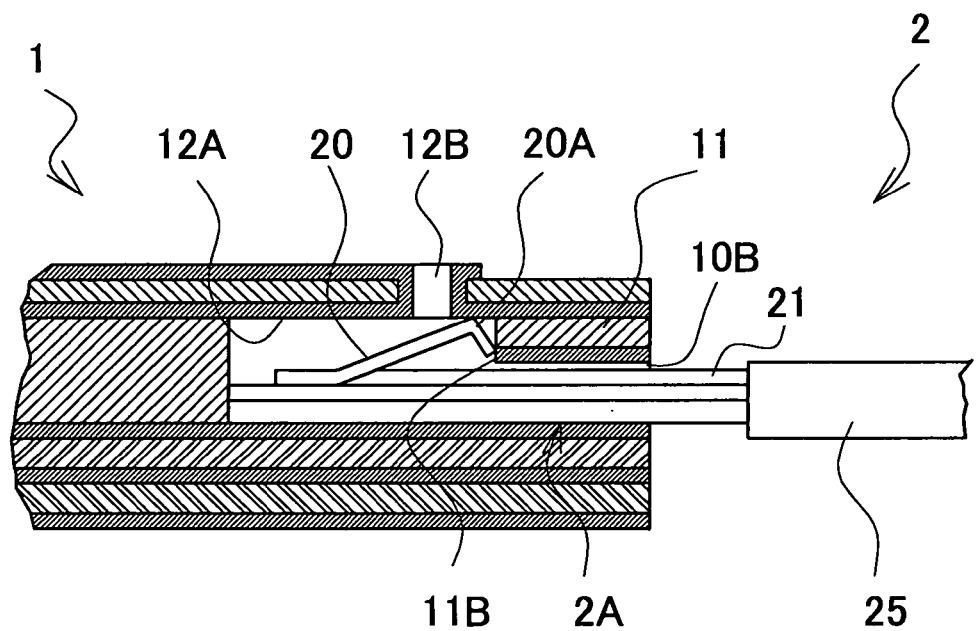
FIG. 4 is a diagram for describing a procedure for inserting the FPC into the printed wiring board according to the first embodiment.

Next, description will be given regarding a procedure for inserting the FPC 2 into the printed wiring board 1 with reference to FIG. 4.

Upon inserting the end portion of the FPC 2 into the insertion opening 10B of the printed wiring board 1, the tip of each first contact terminal 20 comes into contact with the edge of the insertion opening 10B. Furthermore, upon inserting the FPC 2 further, the first contact terminals 20 are pressed to the internal wall surface of the insertion opening 10B, are elastically deformed, and come close to the conductors 21. Moreover, upon inserting the FPC 2 even further, the tip of each first contact terminal 20 extends past the stepped structure 11B. Thus, each first contact terminal 20 returns to a position predetermined by the height of the stepped structure 11B, and the tip thereof comes in contact with and is pressed into the line connecting terminal 12A. Thus, the tip of each first contact terminal 20 of the FPC 2 is engaged with the stepped structure 11B.

In this state, it is impossible to pull out the FPC 2 even when trying to pull out the FPC 2 from the printed wiring board since the tip of each first contact terminal is engaged with the stepped structure. This allows the FPC to be connected to the printed wiring board surely.

Furthermore, a pin, for example, may be inserted into each of the through holes 12B, and a tip of the pin presses the first through hole terminal 20. It allows extracting first connecting terminal from the printed wiring board 1 easily.

Second Embodiment

In the present embodiment, a first contact terminal 40 has a different configuration from that of the first embodiment.

Figure 5:
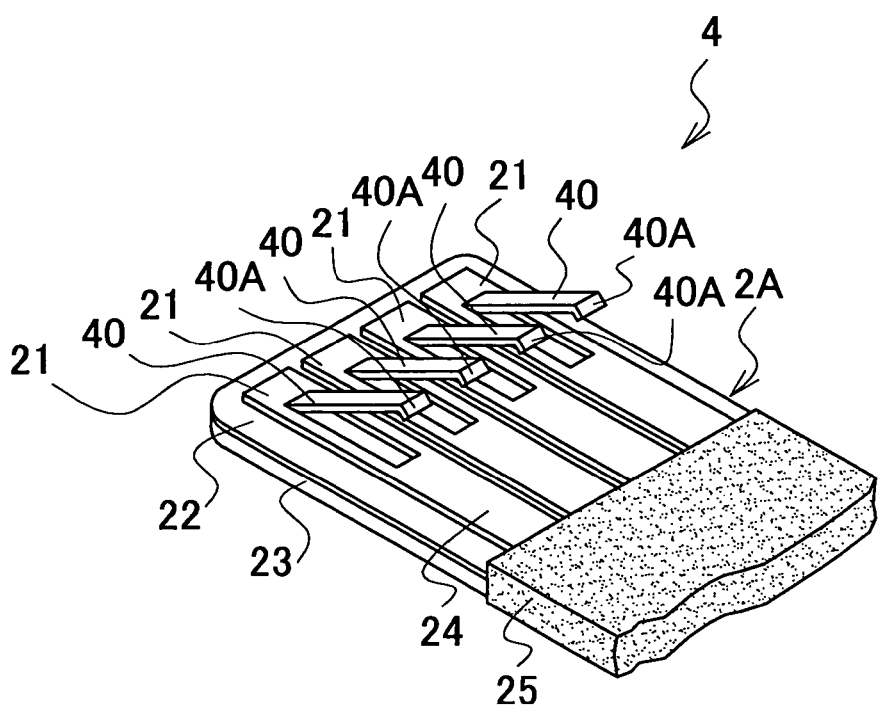
FIG. 5 is a perspective view of an FPC according to a second embodiment of the present invention.

FIG. 5 is a perspective view of an FPC 4 according to the second embodiment of the present invention.

That is to say, each first contact terminal 40 is formed by notching a part of each conductor 21 substantially in the shape of a "C", and by bending up the notched part. A first contact terminal 40 is formed with approximately half the width of the conductor 21. Each first contact terminal 40 has a protrusion 40A at the tip thereof, which is bent down in the direction substantially perpendicular to a conductor 21, in the same way as with the first contact terminal 20 according to the first embodiment.

Third Embodiment

In the present embodiment, an exposed conductor part 3A of an FPC 3 has a different configuration from that of the first embodiment.

Figure 6:
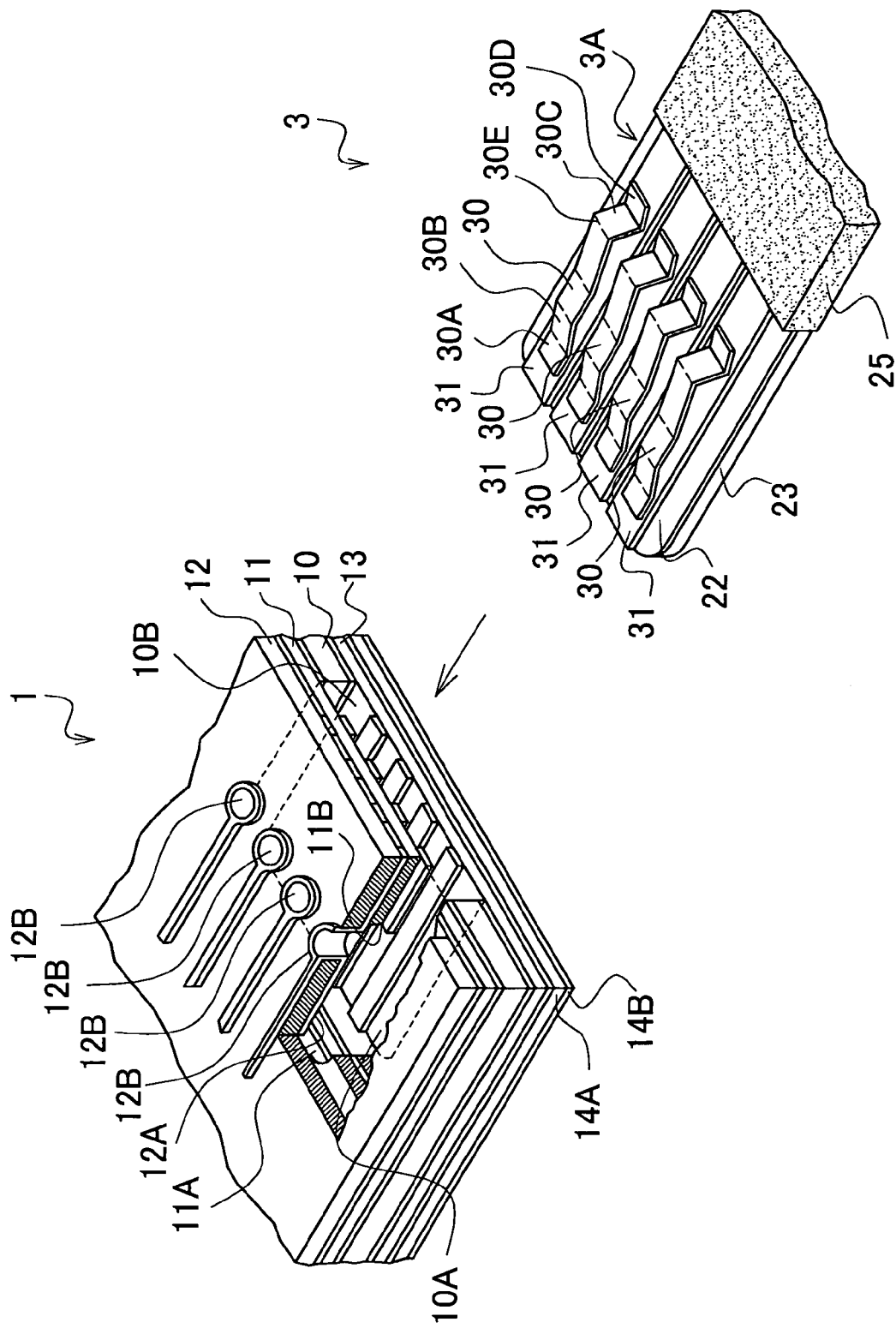
FIG. 6 is a perspective view of an FPC and a printed wiring board according to a third embodiment of the present invention.

FIG. 6 is a perspective view of the FPC 3 and the printed wiring board 1 according to the present embodiment.

The exposed conductor part 3A of the FPC 3 includes: plural conductors 31 extending along the axial direction of the substrate 22; and elastically deformable second contact terminals 30, each of which is formed on the face of each conductor 31.

Each second contact terminal 30 extends toward the base end of the FPC 3. The tip thereof is bent toward the conductors 31. That is to say, each second contact terminal 30 includes a flat portion 30A fixed to the conductors 31, a first inclined portion 30B extending upward from the flat portion 30A, a second inclined portion 30C extending downward from the first inclined portion 30B, and a third inclined portion 30D extending upward from the second inclined portion 30C.

The substantial center portion of the second contact terminal 30 protrudes furthest, which will be referred to as "terminal protrusion 30E" hereafter. The bent portion from the second inclined portion 30C to the third inclined portion 30D form a slight gap between the bent portion and the face of the conductor 31.

The flat portion 30A of each second contact terminal 30 is fixed on each conductor 31 of the exposed conductor part 3A by soldering or the like. The second contact terminals 30 are arrayed in a line.

Fourth Embodiment

In the present embodiment, an exposed conductor part 5A of an FPC 5 has a different configuration from that of the first embodiment.

Figure 7:
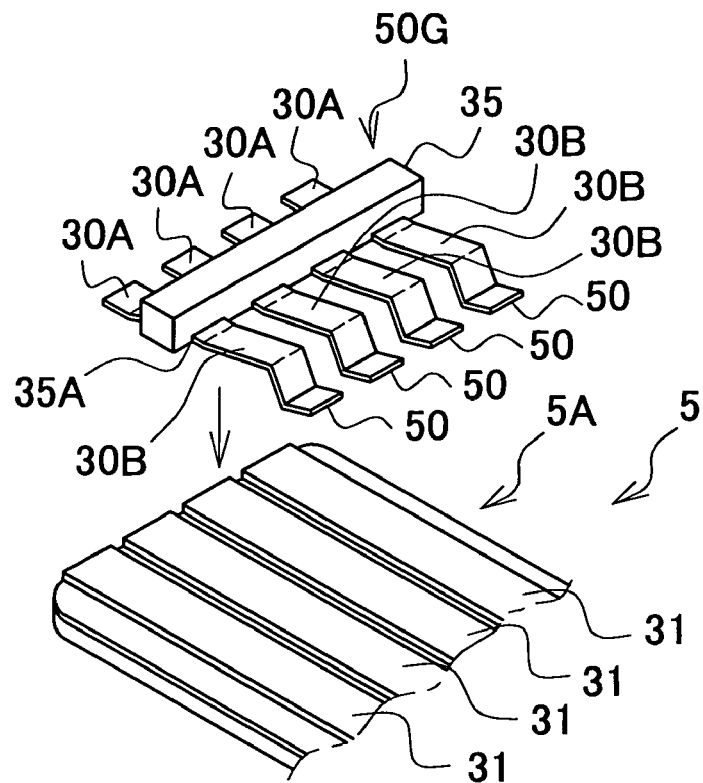
FIG. 7 is an exploded perspective view of an FPC according to a fourth embodiment of the present invention.

FIG. 7 is an exploded perspective view of the FPC 5 according to the present embodiment.

The exposed conductor part 5A of the FPC 5 includes: plural conductors 31 extending along the axial direction of the substrate 22; and elastically deformable second contact terminals 50 each of which is formed on the face of each conductor 31; and an insulating holder plate 35 for connecting the second contact terminals 50 with each other.

The holder plate 35 is provided so as to extend orthogonally in the direction in which each second contact terminal 50 extends. Furthermore, the holder plate 35 has comb-tooth grooves on the face thereof facing the conductors 31.

Each second contact terminal 50 includes a flat portion 30A, a first inclined portion 30B, a second inclined portion 30C, and a third inclined portion 30D, in the same way as with the second contact terminals 30 according to the third embodiment. Furthermore, each second contact terminal 50 has a small protrusion (not shown) between the first inclined portion 30B and the second inclined portion 30C. The small protrusion is pressed to comb-tooth grooves 35A formed on the face of the holder plate 35. This allows the second contact terminals 50 to be fixed on the holder plate 35.

Therefore, the plural second contact terminals 50 are integrated with the holder plate 35, thereby forming a single in-line connecting terminal 50G. Then, the single in-line connecting terminal 50G is only need to be subassembled with the conductors 31 to assemble the FPC 5 easily without necessity of subassembling the second connecting terminals 50 to the conductors 31 individually.

Figure 8:
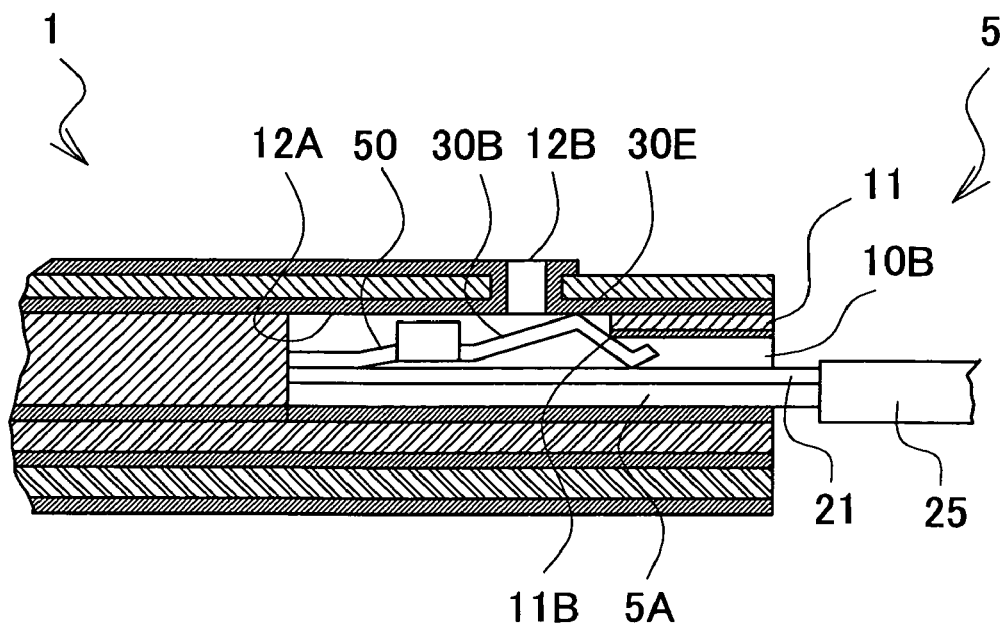
FIG. 8 is a diagram for describing a procedure for inserting the FPC into the printed wiring board according to the fourth embodiment.

Next, description will be made regarding engagement action between the FPC 5 and the printed wiring board 1 with reference to FIG. 8.

Upon inserting the end portion of the FPC 5 into the insertion opening 10B of the printed wiring board 1, the tip of each first contact terminals 50 come in contact with the edge of the insertion opening 10B. Furthermore, upon inserting the FPC 5 further, the first contact terminals 50 are pressed into the internal wall surface of the insertion opening 10B, elastically deformed, and come close to the conductors 21. Moreover, upon inserting the FPC 5 even further, the tip of each first contact terminal 50 extends past the stepped structure 11B. Thus, each first contact terminal 50 returns to a position predetermined by the height of the stepped structure 11B, and the tip thereof comes in contact with and is pressed into the line connecting terminal 12A. Thus, the tip of each first contact terminal 50 of the FPC 5 is engaged with the stepped structure 11B.

In this state, it is impossible to pull but the FPC 5 even when trying to pull out the FPC 5 from the printed wiring board 1 since the tip of each first contact terminal 50 is engaged with the stepped structure 11B. This allows the FPC 5 to be connected to the printed wiring board 1 surely.

The present invention has the following advantages.

Upon inserting the end portion of the FPC into the insertion opening of the printed wiring board, the tip of each first contact terminal of the FPC comes in contact with and is pressed to the line connecting terminal formed within the insertion opening. Since the connector structure to be connected to the FPC is provided inside the printed wiring board, the circuit elements can be mounted at high density, and thus improves a degree-of-freedom in designing wiring patterns.

The invention claimed is:

1. A connecting structure for a printed wiring board for electrically connecting an FPC, wherein said FPC comprises:
    an elongated substrate; and
    a conductor part laminated on a surface of said substrate, wherein said conductor part comprises:
    a plurality of conductors extending along an axial direction of said substrate; and
    contact terminals, each of which extends from a surface of a conductor toward a base end of said FPC, and each of which is elastically deformable,
    wherein said printed wiring board comprises:
    an insertion opening provided on an edge surface thereof for inserting an end portion of said FPC; and
    a plurality of line connecting terminals, which is formed on an internal wall surface of said insertion opening, extending along an insertion direction of said FPC,
    wherein when the end portion of said FPC is inserted into said insertion opening of said printed wiring board, a tip of each contact terminal of said FPC comes in pressure contact with a line connecting terminal by a force resulting from an elastic deformation of the contact terminal.

2. A connecting structure for a printed wiring board according to claim 1, wherein the insertion opening comprises a stepped structure formed on the internal wall surface thereof, and
    wherein when said FPC is inserted into said printed wiring board, the tip of each contact terminal of said FPC is engaged with said stepped structure.

3. A connecting structure for a printed wiring board according to claim 1, wherein each of said contact terminals is formed by bending a part of said conductors.

4. A connecting structure for a printed wiring board according to claim 1, wherein tips of said first contact terminals are arrayed in a line.

5. A connecting structure for a printed wiring board for electrically connecting an FPC, wherein said FPC comprises:
    an elongated substrate; and
    a conductor part laminated on a surface of said substrate, wherein said conductor part comprises:
    a plurality of conductors extending along an axial direction of said substrate; and
    elastically deformable contact terminals, each being provided on a surface of a conductor,
    wherein each contact terminal extends toward a base and of said FPC, and a tip thereof is bent toward a conductor,
    wherein said printed wiring board comprises:
    an insertion opening formed on an edge surface thereof for inserting an end portion of said FPC; and
    a plurality of line connecting terminals, which is formed on an internal wall surface of said insertion opening, extending along an inserting direction of said FPC,
    wherein when the end portion of said FPC is inserted into said insertion opening of said printed wiring board, each contact terminal of said FPC comes in pressure contact with a line connecting terminal, and
    said FPC further comprising an insulating holder plate for connecting said contact terminals with each other, wherein said holder plate has grooves,
    and said contact terminals are pressed into said grooves of said holder plate, thereby fixing said contact terminals to said holder plate.

6. A connecting structure for a printed wiring board according to claim 5, wherein said insertion opening comprises a stepped structure formed on the internal wall surface thereof, and
wherein when said FPC is inserted into said printed wiring board, each contact terminal of said FPC is engaged with a stepped structure.

7. A connecting structure for a printed wiring board according to claim 5, wherein said contact terminals are arrayed in a line.

8. A connecting structure for a printed wiring board for electrically connecting an FPC, wherein said FPC comprises:
an elongated substrate; and
a conductor part laminated on a surface of said substrate, wherein said conductor part comprises:
a plurality of conductors extending along an axial direction of said substrate; and
elastically deformable contact terminals, each extending from a surface of a conductor toward a base end of said FPC,
wherein said printed wiring board comprises:
an insertion opening provided on an edge surface thereof for inserting an end portion of said FPC; and
a plurality of line connecting terminals, which is formed on an internal wall surface of said insertion opening, extending along an insertion direction of said FPC,
wherein when the end portion of said FPC is inserted into said insertion opening of said printed wiring board, a tip of each contact terminal of said FPC comes in pressure contact with a line connecting terminal,
wherein said printed wiring board further comprises a laminated second outer layer plate, an inner layer plate having a cutout having an open side at an edge surface thereof, and a third outer layer plate,
wherein said line connecting terminals are provided on a face of said second outer layer plate facing said cutout, and
wherein said insertion opening is defined by said second outer layer plate, said inner layer plate having said cutout, and said third outer layer plate.

9. A connecting structure for a printed wiring board according to claim 5, wherein said printed wiring board further comprises a laminated second outer layer plate, an inner layer plate having a cutout having an open side at an edge surface thereof, and a third outer layer plate,
wherein said line connecting terminals are provided on a face of said second outer layer plate facing said cutout, and
wherein said insertion opening is defined by said second outer layer plate, said inner layer plate having said cutout, and said third outer layer plate.

10. A connecting structure for a printed wiring board according to claim 8, wherein said printed wiring board further comprises a first outer layer plate having a rectangular opening, the first outer layer plate lying between said second outer layer plate and said inner layer plate, and
wherein a stepped structure is formed said cutout of said inner layer plate and said opening of said first outer layer plate.

11. A connecting structure for a printed wiring board according to claim 10, wherein said second outer layer plate and said third outer layer plate have wiring patterns on both faces thereof,
wherein said inner layer plate is formed of an insulating plate,
wherein said first outer layer plate has a wiring pattern on a face thereof facing said inner layer plate, and
wherein said second outer layer plate, said first outer layer plate, said inner layer plate, and said third outer layer plate, are connected with each other by solder plating.

12. A connecting structure for a printed wiring board according to claim 11, wherein a prepreg and a copper film are further laminated on said first outer layer plate and said third outer layer plate.

13. A connecting structure for a printed wiring board according to claim 11, wherein said second outer layer plate has a plurality of through holes connected to said line connecting terminals.

14. A connecting structure for a printed wiring board according to claim 8, wherein said line connecting terminals of said printed wiring board are subjected to hard plating.

15. A connecting structure for a printed wiring board according claim 14, wherein said line connecting terminals of said printed wiring board are subjected to gold plating further on a surface of said hard plating.

* * * * *